Sept. 8, 1964 G. E. THERIAULT 3,148,332

SIGNAL TRANSLATING SYSTEM WITH ISOLATION OF
INPUT TERMINALS FROM OUTPUT TERMINALS
Filed Oct. 22, 1959

INVENTOR.
GERALD E. THERIAULT
BY Eugene M. Whitacre
ATTORNEY

United States Patent Office 3,148,332
Patented Sept. 8, 1964

3,148,332

SIGNAL TRANSLATING SYSTEM WITH ISOLATION OF INPUT TERMINALS FROM OUTPUT TERMINALS

Gerald E. Theriault, Haddon Heights, N.J., assignor to Radio Corporation of America, a corporation of Delaware Filed Oct. 22, 1959, Ser. No. 848,033
8 Claims. (Cl. 325—485)

This invention relates to electrical signal translating systems, and more particularly to systems including two-terminal negative resistance signal translating stages.

In a two-terminal negative resistance signal translating stage, the input and output signals appear across the same terminals. An example of such a stage is an amplifier including a negative resistance diode. One problem encountered in the design of electronic apparatus including two-terminal negative resistance stages, such as amplifiers, is that of efficiently coupling such stages in cascade relation because the input and output signals of both stages are present across the same terminals. Another problem encountered in the design of two-terminal negative resistance signal translating stages is that the gain thereof may be unstable and may undesirably change due to variations in the effective negative resistance of the negative resistance device which may be caused by changes in the input signal level or slight shifts in the direct current (D.-C.) operating voltage.

It is an object of this invention to provide an improved electrical network including a two-terminal negative resistance signal translating stage.

Another object of this invention is to provide improved means for efficiently coupling a two-terminal negative resistance signal translating stage in cascade with other signal translating stages.

A further object of this invention is to provide means for stabilizing the operation of a two-terminal negative resistance stage, such as an amplifier stage including a negative resistance diode against variations in gain due to changes in effective negative resistance of the diode caused by changes in signal level or D.-C. operating voltage or the like.

In accordance with the invention a two-terminal negative resistance signal translating stage including a negative resistance device as the active element thereof, is coupled to the input circuit of a four-terminal signal translating stage including a transistor. Changes in the effective negative resistance of the negative resistance device, which affect the gain of the two-terminal stages, effectively appear across the input circuit of the transistor stage. The transistor stage is provided with means, such as a feedback circuit, for controlling the loading effect of the transistor stage on the two-terminal stage in response to changes in the effective negative resistance of the negative resistance device. The changes of this loading effect are in a direction to maintain the power gain of the two-terminal stage at the desired value.

The combination of a two-terminal negative resistance signal translating stage with a four-terminal signal translating stage including a transistor effectively provides an overall four-terminal network wherein the input terminals of the combination are isolated from the output terminals thereof. Thus, the combination may be efficiently utilized in cascade with other signal translating stages of electronic apparatus. When used as an amplifier, the circuit of this combination is less complicated than two transistor stages connected in cascade, but is capable of providing comparable gain.

The novel features that are considered to be characteristic of this invention are set forth with particularity in the appended claims. The invention itself, however, both as to its organization and method of operation as well as additional objects and advantages thereof, will best be understood from the following description when read in connection with the accompanying drawings, in which:

Figures 1, 2, 3, 4, 5:
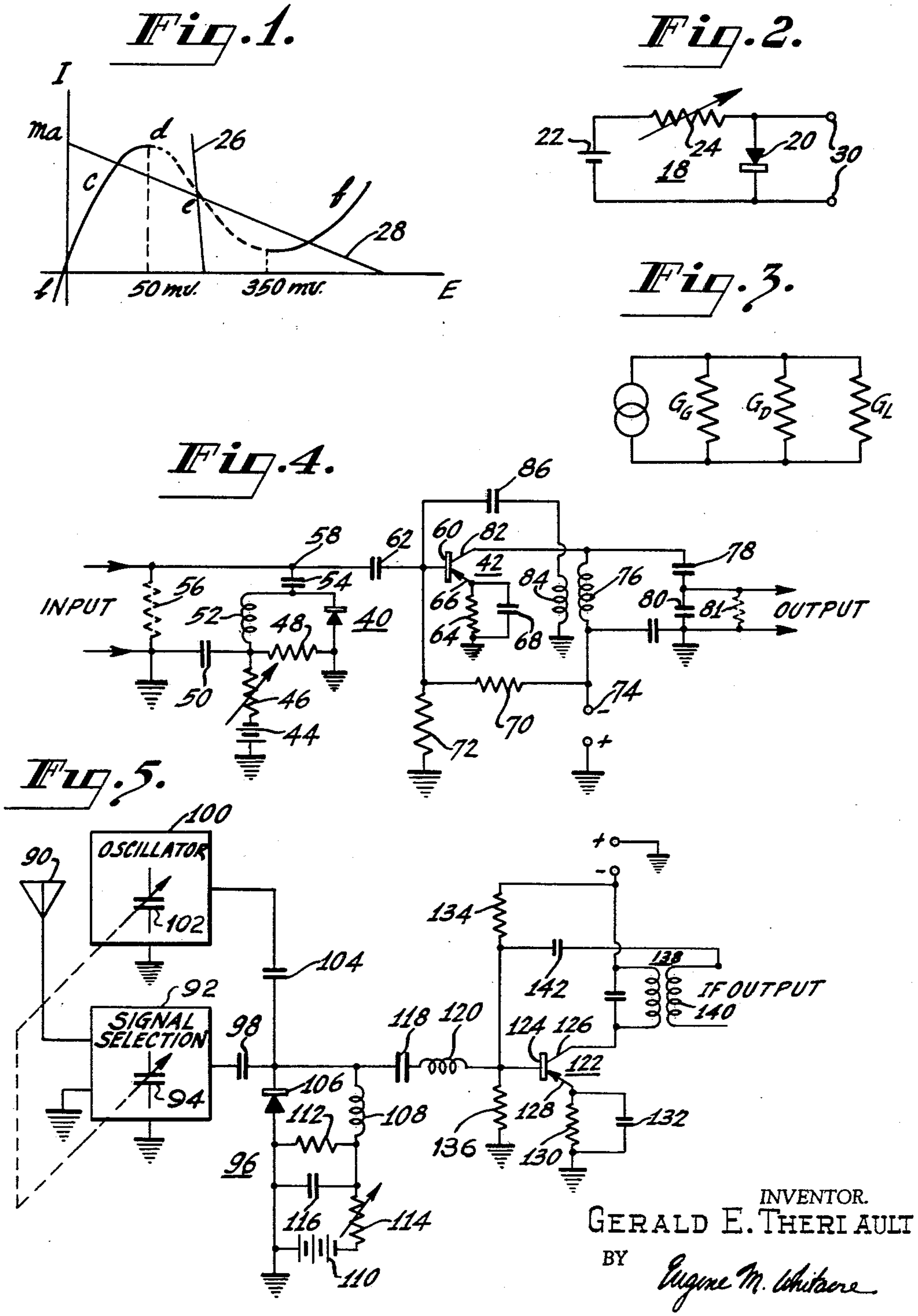
FIGURE 1 is a graph illustrating the voltage-current characteristic of a voltage controlled negative resistance diode.
FIGURE 2 is a schematic circuit diagram of a D.-C. bias circuit for the diode of FIGURE 1.
FIGURE 3 is an equivalent circuit diagram of a two-terminal negative resistance signal translating stage.
FIGURE 4 is a schematic circuit diagram of a two-terminal negative resistance signal translating stage coupled to a four-terminal transistor signal translating stage in accordance with the invention.
FIGURE 5 is a schematic circuit diagram of a superheterodyne signal receiver including circuits embodying the invention.

The principles of the present invention are particularly, although not exclusively, applicable to signal translating systems using negative resistance diodes. Negative resistance diodes may be divided into two general categories: current controlled negative resistance diodes, an example of which is described in U.S. Patent 2,855,524 issued October 7, 1958 to Shockley; and voltage controlled negative resistance diodes an example of which is described by H. S. Sommers, Proceeding of the IRE, July 1959, page 1201–1205. Although either type of diode may be used in circuits embodying the invention, the circuits shown and described in this application illustrate the use of a voltage controlled diode.

The current-voltage characteristic of a typical voltage controlled negative resistance diode suitable for use with circuits embodying the invention is shown in FIGURE 1. The current scales depend on area and doping of the junction, but representative currents are in the milliampere range.

For a voltage in the back direction, the back current of the diode increases as a function of voltage as is indicated by the (region *b* of FIGURE 1).

For forward bias voltages, the characteristic is substantially symmetrical (FIGURE 1, region *c*). The small forward current is believed to be caused by quantum mechanical tunneling. At higher forward bias voltages, about 50 millivolts (mv.), the forward current thought to exist due to tunneling reaches a maximum (region *d*, FIGURE 1), and then begins to decrease. This drop continues (FIGURE 1, region *e*) until eventually, at about 350 mv., normal injection over the barrier becomes important and the characteristic turns into the usual forward behavior of a semiconductor diode (region *f*, FIGURE 1).

The negative resistance of the diode is the incremental change in voltage divided by the incremental change in current, or the reciprocal slope of the (region *e* of FIGURE 1). To bias the diode for stable operation in the negative resistance region of its characteristic requires a suitable voltage source having a smaller internal impedance than the negative resistance of the diode. As shown in FIGURE 2 the voltage source 18 may comprise a battery 22 and a variable resistor 24, with the internal resistance of the source being the sum of the internal resistance of battery 22 and the adjusted resistance of the variable resistor 24. Such a voltage source has a D.-C. load line 26 as indicated in FIGURE 1, which is characterized by a current-voltage relationship which has a greater slope than the negative slope in absolute value of the diode characteristic and intersects the diode characteristic at only a single point. If the voltage source 18 has an internal resistance which is greater than the negative resistance of the diode, the source would have a load line 28 with a smaller slope than the negative slope in absolute value of the diode characteristic as indicated in FIGURE 1, and would intersect the diode characteristic curve at three points. Under the latter conditions the diode is not stably biased in the negative resistance region. This lack of stability is because an incremental change in current through the diode due to transient or noise currents or the like produces a regenerative reaction which causes the diode to assume one of its two stable states represented by the intersection of the load line 28 with the positive resistance portions of the diode characteristic curve.

A simplified alternating current (A.-C.) circuit diagram of a two-terminal negative resistance amplifier device is shown in FIGURE 3. The diode is represented as an equivalent conductance $G_D$, and is stably biased in the negative resistance region of its characteristic, preferably at the minimum in absolute value negative resistance point, by a D.-C. biasing circuit, not shown. The equivalent conductances of the source and load circuits connected to the diode are indicated as $G_G$ and $G_L$ respectively. For stable amplification the total positive conductance of the source and load circuits $G_G+G_L$ must exceed the negative conductance of the diode $G_D$.

The power gain for this circuit is equal to: $\frac{\text{Power Out}}{\text{Power In}}$ Assuming optimum match between the source $G_G$ and the load, the power in may be expressed:

$$\text{Power In}=E^2G_G \tag{1}$$

wherein E is the source voltage but $$E=\frac{I}{2G_G} \tag{2}$$

wherein I is the total current substituting (2) in Formula 1.

$$\text{Power In}=\frac{I^2}{4G_G} \tag{3}$$

Power out may be expressed as follows:

$$\text{Power Out}=E^2G_L \tag{4}$$

but $$E=\frac{I}{G_G+G_L-G_D} \tag{5}$$

Substituting (5) in Formula 4, $$\text{Power Out}=\frac{I^2G_L}{(G_G+G_L-G_D)^2} \tag{6}$$

Thus $$\text{Power Gain}=\frac{\text{Power Out}}{\text{Power In}}=\frac{\frac{I^2G_L}{(G_G+G_L-G_D)^2}}{\frac{I^2}{4G_G}} \tag{6A}$$

$$\text{Power Gain}=\frac{4G_LG_G}{(G_G+G_L-G_D)^2} \tag{7}$$

Thus for high gain $G_D$, the negative conductance of the diode in absolute value should approach the total positive conductance of the circuit, $G_G+G_L$. If the negative conductance of the diode changes with applied signal level or with small changes in D.-C. bias or the like, the amplifier gain will be changed. With the diode initially biased at its maximum negative conductance point, which corresponds to the steepest vertical slope in the negative resistance region of the diode characteristic, then any changes in the operating parameters thereof can result only in decreased negative conductance, and therefore, decreased gain. However, if the diode is not initially biased at its minimum negative conductance point, then changes in the operating conditions may cause the negative conductance to increase to a value greater than the positive conductance of the source and load. Under such conditions, the circuit is unstable and will tend to oscillate.

In accordance with the invention, the gain of a two terminal negative resistance signal translating stage is stabilized by causing the total positive conductance presented to the stage to change in accordance with the changes of diode negative conductance in such a manner that the total resultant conductance of the circuit is maintained more nearly constant. In other words, if the denominator of Equation 7 is kept more nearly constant, the stability of two terminal negative conductance stage will be improved.

An example of a circuit embodying the invention is shown in FIGURE 4 which is a schematic circuit diagram of a tuned amplifier such as an intermediate frequency (I-F) amplifier for use in superheterodyne signal receivers or the like. The I-F amplifier includes a two-terminal stage including a negative resistance diode 40, and a four-terminal stage including a transistor 42, which has an input circuit and an output circuit that is substantially isolated from the input circuit. The diode 40 is biased to exhibit a negative resistance by a D.-C. biasing network including a battery 44, and a voltage divider comprised of a variable resistor 46 and a fixed resistor 48. The resistor 48 is smaller in resistance value than the absolute value of the negative resistance of the diode 40 to enable stable biasing in the negative resistance region of the diode characteristics. Signal frequencies appearing at the junction of the resistors 46 and 48 are bypassed to ground through a capacitor 50. The capacitor 50 is preferably of large enough capacitance value to overdamp the biasing circuit to prevent parasitic oscillations from occurring therein.

The voltage developed across the resistor 48 is applied to the cathode of the diode 40 through a tuning inductor 52 which is selected to resonate with the diode capacitance at the intermediate frequency. The inductor 52 is effectively connected in parallel with the diode 40 through the capacitor 50 which offers low impedance to I-F signals.

Signals from a suitable source, such as a preceding transistor stage, not shown, are applied to the two-terminal amplifier stage through a D.-C. blocking capacitor 54. The source resistance is represented schematically as a resistor 56. The amplified output signal from the two-terminal amplifier stage appears between the terminal 58 and ground and is applied to the base 60 of the transistor 42 through a coupling capacitor 62.

Self biasing for the transistor 42 is provided by a resistor 64 which is connected between the emitter 66 and ground. A signal bypass capacitor 68 is connected in parallel with resistor 64. A D.-C. biasing potential for the base 60 is provided by a voltage divider including the resistors 70 and 72 which are connected between the negative terminal of the operating potential supply 74 which may comprise the battery 44.

Signals amplified by the four-terminal network are developed across an output circuit including an inductor 76 tuned to the I-F by a pair of series connected capacitors 78 and 80. The inductor 76 connects the collector 82 of the transistor 42 to the negative terminal of the operating potential supply 74. Amplified output signals may be derived across the capacitor 80 for application to utilization means represented by a load resistor 81.

The transistor amplifier includes a feedback circuit, such as a negative feedback circuit, including an inductor 84 (coupled to the inductor 76), and a neutralizing capacitor 86 connected in series between the base 60 and ground. The feedback circuit is adjusted so that changes in the absolute value of the diode 40 negative conductance, appearing across the transistor input circuit, cause the absolute value of the positive input conductance of the transistor amplifier to change in the same direction. For example, as the diode negative conductance decreases, the transistor positive input conductance also decreases and vice-versa.

In operation, the resistor 46 is adjusted so that the diode 40 is biased to exhibit a negative resistance, such as, for example, its minimum negative resistance or maximum negative conductance and the source and load circuits are designed to present a slightly greater positive conductance. If the biasing potential should change by a few millivolts, then the diode negative conductance will change causing a change of the two-terminal network gain. In the case where the diode is at its maximum negative conductance, the shift in biasing voltage causes the diode negative conductance to decrease. Where the diode 40 and transistor 42 are operated from the same operating potential source, such a small shift in voltage has a negligible effect on the transistor operation.

Since the two-terminal negative resistance amplifier circuit comprises the driving source for the transistor, a change in the diode negative conductance causes a change in the apparent source conductance, thereby producing a change in the transistor input conductance due to the action of the feedback circuit. More specifically, as the absolute value of the diode negative conductance $G_D$ decreases, the feedback circuit causes the positive input conductance of the transistor to decrease. Since the transistor input conductance comprises the diode load conductance and the absolute values of the positive and negative conductances in the diode circuit are changing in the the same direction; consequently, the denominator of Equation 7 is more nearly constant thus improving gain stability.

The overall gain for the circuit shown in FIGURE 4 is comparable to that of two transistor amplifier stages connected in cascade. Furthermore the combination of the two-terminal and four-terminal networks may be efficiently cascaded with other signal translating stages in electronic apparatus such as signal receivers.

FIGURE 5 illustrates a portion of a superheterodyne radio signal receiver including a negative resistance diode as a signal mixer, or first detector. A desired radio signal intercepted by an antenna 90 is selected by a signal selection stage 92. The signal selection stage 92 may include an R-F amplifier, not shown, and tunable resonant circuits, not shown, that are tuned to the frequency of the selected radio signal by a suitable tuning element such as a capacitor 94. The selected signal is then fed to a signal mixer stage 96 through a coupling capacitor 98.

A local oscillator stage 100 which includes a tuning element, such as a variable capacitor 102, provides a heterodyning signal for the mixer stage 96. The variable capacitors 94 and 102 are ganged for unicontrol operation, as indicated by the dashed line, to tune the oscillator in tracking relation with the tunable resonant circuits of the signal selection stage 92. The heterodyning signal from the local oscillator is fed to the signal mixer stage 96 through a coupling capacitor 104.

The signal mixer stage 96 includes a negative resistance diode 106 the capacitance of which is tuned to the receiver intermediate frequency by an inductor 108. The diode 106 is biased to exhibit a non-linear negative resistance by a D.-C. biasing network including a battery 110, and a voltage divider comprising a fixed resistor 112 and a variable resistor 114. Referring to the curve of FIGURE 1, the diode 106 may, for example, be biased near the non-linear region at the current maximum region *d* or near the non-linear region at the broad current minimum between regions *e* and *f*. A capacitor 116 connects the junction of the resistors 112 and 114 to ground to provide a low impedance path for I-F signals, and also may serve to overdamp the biasing circuit to suppress parasitic oscillation therein.

The non-linear interaction of the selected radio and oscillator signals produces sidebands or beat frequency signals, one of which is the I-F signal. Since the negative resistance diode supplies power to the circuit, a power gain may be achieved at intermediate frequencies as opposed to a power loss exhibited by conventional diode mixers. Signal mixer stages using negative resistance diodes are described in greater detail in the copending application of K. N. Chang entitled Frequency Converter, Serial Number 828,342, filed July 20, 1959 now U.S. Patent No. 3,125,725 issued March 17, 1964 and assigned to the assignee of this application.

I-F signals from the mixer stage 96 are fed through a series resonant circuit including a capacitor 118 and inductor 120 tuned to the I-F, to an I-F amplifier stage 122. The amplifier stage 122 includes a transistor having a base electrode 124, a collector electrode 126 and an emitter electrode 128. A self biasing network comprising the parallel combination of a resistor 130 and capacitor 132 is connected between the emitter electrode 128 and ground. The transistor is biased to the desired point on its operating characteristic by a voltage divider including a pair of resistors 134 and 136 connected between the negative terminal of an operating potential supply and ground, with the base electrode 124 being connected to the junction of these resistors.

Amplified I-F signals are developed across the primary winding of an I-F transformer 138, connected in the collector electrode 126 circuit. The primary winding, which is tuned to the I-F, is coupled to a secondary winding 140, that is, in turn, connected to drive further stages not shown. By way of example the input terminals of a circuit similar to that shown in FIGURE 4 may be coupled to the secondary winding 140.

The I-F amplifier 122 includes a neutralization capacitor 142 connected between the secondary winding 140 and the base electrode 124. The neutralization capacitor controls the feedback of signal energy from the output circuit to the input circuit of amplifier 122 to control the loading effect of the transistor on the mixer circuit, and improve the stability of mixer operation. More specifically, as the negative conductance of the diode 106 decreases, the effect on the I-F amplifier 122 circuit is such that the input conductance thereof also decreases. As explained above in connection with FIGURE 4, this change is in the proper direction to improve the stability of negative resistance diode circuit operation. Thus transients, changes in signal level, or slight change in bias on the diode 106, which tend to affect the negative conductance of the diode, are at least in part compensated by the change in loading on the diode circuit by the transistor circuit to improve the stability of mixer stage operation.

What is claimed is:

1. A signal translating system comprising means providing a source of signals, a two-terminal negative resistance signal translating stage coupled to said last named means, said signal translating stage including a negative resistance diode stably biased to exhibit a negative resistance a four-terminal network having an input circuit and an output circuit, said four terminal network including a transistor having base, emitter and collector electrodes interconnected as an amplifier between said input and output circuits so that said input and output circuits are effectively isolated from each other, means coupling said input circuit to said two-terminal negative resistance signal translating stage, and utilization means coupled to said output circuit.

2. A signal translating system comprising in combination a negative resistance amplifier having a pair of terminals between which signals to be amplified are applied and across which amplified signals may be derived, a four-terminal signal translating stage having an input circuit and an output circuit, said four terminal signal translating stage including a transistor having base, collector and emitter electrodes, said base and emitter electrodes being connected to said input circuit and one of said base and emitter electrodes and said collector electrode being connected to said output circuit to provide effective isolation between said input and output circuits, means connecting said input circuit between the pair of terminals of said negative resistance amplifier, means for applying signals to be amplified between said pair of terminals, and utilization means connected with said output circuit.

3. A signal translating system comprising in combination, a voltage controlled negative resistance diode, inductive circuit means coupled to said diode and selected to resonate with the diode capacitance at a predetermined frequency, biasing means direct current conductively connected to said diode to bias said diode to exhibit a negative conductance, the effective conductance of said biasing means being greater than the absolute value of the maximum negative conductance of said diode so that said diode is stably biased to exhibit a negative conductance, means providing a signal source having a predetermined positive conductance coupled to said diode for applying signals to be amplified thereto, means providing an amplifier circuit including a transistor including base, emitter and collector electrodes and exhibiting a predetermined positive conductance between said base and emitter electrodes, means coupling said diode between said emitter and base electrodes, the total positive conductance of said signal source means and the conductance between said emitter and base electrodes selected to exceed the absolute value of the negative conductance of said diode at said predetermined frequency, neutralization circuit means coupled between said collector and base electrodes, and utilization circuit means coupled to said collector electrode, whereby said utilization circuit means is effectively isolated from said signal source means.

4. A bandpass amplifier circuit comprising, in combination, a voltage controlled negative resistance diode, inductive circuit means coupled to said diode and selected to resonate with the diode capacitance at a predetermined frequency, biasing means direct current conductively connected to said diode to bias said diode to exhibit a negative conductance, the effective conductance of said biasing means being greater than the absolute value of the maximum negative conductance of said diode so that said diode is stably biased to exhibit a negative conductance, means providing a signal source having a predetermined positive conductance coupled to said diode for applying signals to be amplified thereto, means providing an amplifier circuit including a transistor including base, emitter, and collector electrodes and exhibiting a predetermined positive conductance between said base and emitter electrodes, means coupling said diode between said emitter and base electrodes, the total positive conductance of said signal source means and between said emitter and base electrodes selected to exceed the absolute value of the negative conductance of said diode at said predetermined frequency, utilization circuit means coupled to said collector electrode, whereby said utilization circuit means is effectively isolated from said signal source, means and a neutralization circuit coupled between the circuits connected with said collector and said base to change the positive conductance appearing between said base and emitter electrodes in the same absolute direction as any changes in the negative conductance of said diode.

5. In a signal translating system including a source of signals, the combination of a two-terminal negative resistance signal translating stage including a negative resistance diode adapted to be stably biased in the negative conductance region thereof and coupled to said source of signals, said negative resistance diode subject to variations in negative conductance thereof, a four-terminal signal translating stage coupled to said two-terminal negative resistance signal translating stage, and means responsive to changes in the negative conductance of said diode for causing the absolute value of the positive loading conductance of said four-terminal signal translating stage to change in the same direction as the absolute value of the change in the negative conductance of said diode.

6. A signal translating system including a source of signals, comprising in combination, a two-terminal negative resistance amplifier stage including a negative resistance diode adapted to be coupled to said source of signals, means for stably biasing said diode to exhibit a negative resistance characteristic, a transistor including an input electrode, an output electrode and a common electrode, means coupling said two-terminal negative resistance amplifier device between said input and common electrodes, an output circuit coupled between said output and common electrodes, and means providing a feedback circuit coupling said output circuit to said input electrode to change the input conductance of said transistor in the same direction as the absolute change of negative conductance exhibited by said diode in said two-terminal negative resistance amplifier stage.

7. A signal translating system comprising, in combination, a two-terminal negative resistance amplifier stage including a voltage controlled negative resistance diode, means for stably biasing said negative resistance diode to exhibit a negative conductance, means providing a signal source having a predetermined positive impedance coupled to said negative resistance amplifier for applying signals to be amplified thereto, a transistor including an input electrode an output electrode and a common electrode and having a predetermined positive conductance between said input and common electrodes, means coupling said two-terminal negative resistance amplifier device between said input and common electrodes, an output circuit coupled between said output and common electrodes, the combined positive conductance of said signal source and of the conductance between the input and common electrodes of said transistor being greater than the absolute value of the negative conductance of said diode, and means providing a negative feedback circuit coupling said output circuit to said input electrode to change the input conductance of said transistor in the same direction as the absolute change of negative conductance exhibited by said diode in said two-terminal negative resistance amplifier stage.

8. In a superheterodyne signal receiver the combination comprising a signal mixing stage comprising a negative resistance diode, means for biasing said diode to exhibit a non-linear negative resistance characteristic, means for applying a signal modulated carrier wave to said diode for mixing with a locally developed oscillator wave which differ in frequency from the frequency of said carrier wave by an amount equal to the receiver intermediate frequency, an inductor connected to said diode to tune the effective capacitance of said diode to said intermediate frequency, an intermediate frequency amplifier stage comprising a transistor having an input electrode, an output electrode, and a common electrode, means coupling said mixer stage between said input and common electrodes, an intermediate frequency output circuit connected between said output and common electrodes, and means providing a feedback circuit coupled between said output and input electrodes for neutralizing said intermediate frequency amplifier to cause the absolute value of the positive input conductance of said amplifier to change in the same direction as any change in the absolute value of the negative conductance of said diode.

References Cited in the file of this patent

UNITED STATES PATENTS

| | | |
|---|---|---|
| 2,857,462 | Lin | Oct. 21, 1958 |
| 2,896,018 | Rhodes et al. | July 21, 1959 |

FOREIGN PATENTS

| | | |
|---|---|---|
| 158,879 | Australia | Sept. 16, 1954 |

OTHER REFERENCES

Gabel: "The Crystal as a Generator and Amplifier," The Wireless World and Radio Review, Oct. 1, 1924 and Oct. 8, 1924, pages 2 to 5 and 47 to 50 respectively.

Chung: "Low-Noise Tunnel-Diode Amplifier," Proceedings of the IRE, July 1954, pages 1268–1269.